United States Patent [19]

Bernier et al.

[11] Patent Number: 5,243,488
[45] Date of Patent: Sep. 7, 1993

[54] PROTECTION CIRCUIT LIMITING OVERVOLTAGES BETWEEN TWO SELECTED LIMITS AND ITS MONOLITHIC INTEGRATION

[75] Inventors: Eric Bernier, Tours; Robert Pezzani, Vouray, both of France

[73] Assignee: SGS-Thomson Microelectronics, S.A., Gentilly, France

[21] Appl. No.: 802,806

[22] Filed: Dec. 6, 1991

[30] Foreign Application Priority Data

Dec. 7, 1990 [FR] France .................. 90 15640

[51] Int. Cl.$^5$ ............................. H02H 9/04
[52] U.S. Cl. ........................ 361/56; 361/91; 361/111; 361/119
[58] Field of Search ............... 361/111, 56, 91, 119, 361/127, 57

[56] References Cited

U.S. PATENT DOCUMENTS

| | | | |
|---|---|---|---|
| 4,282,555 | 8/1981 | Svedberg | 361/56 |
| 4,390,919 | 6/1983 | Lesinski | 361/56 |
| 4,695,916 | 9/1987 | Satoh et al. | 361/56 |

FOREIGN PATENT DOCUMENTS 2218872  11/1989  United Kingdom.

Primary Examiner—Todd E. DeBoer
Attorney, Agent, or Firm—Lowe, Price, LeBlanc & Becker

[57] ABSTRACT

A circuit for protecting lines such as telephone lines against positive or negative overvoltages having respective determined minimum values (+V1 and −V2). Between a common point (C) and a first conductor (A), a second conductor (B) and ground (M), are inserted first, second and third protection components, respectively constituted by a diode (D1, D2, D3) in anti-parallel with a thyristor (T1, T2, T3), the anode of which is connected to the common point and the gate of which receives a polarization signal. The first and second thyristors are of the cathode-gate type and the third (T1) of the anode-gate type. Each of the first and second thyristors is associated with a transistor (TR2, TR3). The emitter of each transistor is connected to the gate of the corresponding thyristor and the collector of each transistor is connected to a second common point (D) connected to the gate of the third thyristor.

5 Claims, 2 Drawing Sheets

PROTECTION CIRCUIT LIMITING OVERVOLTAGES BETWEEN TWO SELECTED LIMITS AND ITS MONOLITHIC INTEGRATION

BACKGROUND OF THE INVENTION

The present invention relates to protection circuits against line overvoltages such as telephone lines, and more particularly relates to circuits enabling to establish different positive or negative overvoltage thresholds. Moreover, the invention provides a circuit that can be associated to a failure detection circuit.

SUMMARY OF THE INVENTION

To achieve these objects, the invention provides a circuit for protecting lines such as telephone lines against positive or negative overvoltages having respective selected minimum values, comprising, between a common point, on the one hand, and a first conductor, a second conductor and ground, on the other, first, second and third protection components. Each protection component comprises a diode in anti-parallel with a thyristor, the anode of which is connected to the common point and the gate of which receives a polarization signal. The first and second thyristors are of the cathode-gate type and the third thyristor is of the anode-gate type. In this circuit, each first and second thyristor is associated with a transistor for amplifying gate current, the emitter of each transistor being connected to the gate of the corresponding thyristor and the collector of each transistor being connected to a second common point connected to the gate of the third thyristor.

Moreover, the invention provides a method for monolithically integrating the circuit according to the invention achieved from an N-type silicon substrate, the rear surface of which corresponds to the common point and the front surface of which comprises the various connection metallizations to the conductors, to ground and to the polarization voltages. The anode-gate thyristor comprises, from the rear surface, a P-type overdoped layer, the substrate corresponding to the anode gate, a P-type well and, on the front surface side, an N-type region provided with emitter shorts connected to a cathode metallization. Each cathode-gate thyristor comprises, from the rear surface, a P-type region, the substrate, a P-type well corresponding to the cathode gate and an N-type region provided with emitter shorts coated with a cathode metallization. Each gate amplification transistor is formed close to the anode-gate thyristor and comprises, from the front surface, a P-type well corresponding to its base wherein is formed an N+-type region corresponding to its emitter and connected by a metallization to the gate well of the corresponding cathode-gate thyristor, the collector of the transistor corresponding to the substrate and, therefore, to the anode gate region of the anode gate thyristor. The rear surface of the substrate, facing the base well of the considered transistor, mainly comprises a P-type region.

BRIEF DESCRIPTION OF THE DRAWINGS

The foregoing and other objects, features and advantages of the invention will be apparent from the following detailed description of preferred embodiments as illustrated in the accompanying figures wherein.

As conventional in integrated circuit representation, it will be noted that the various drawings are not drawn to scale, the sizes and thicknesses of the various layers being arbitrarily reduced or enlarged in order to facilitate the legibility of the drawings.

DETAILED DESCRIPTION OF THE INVENTION

Figure 1:
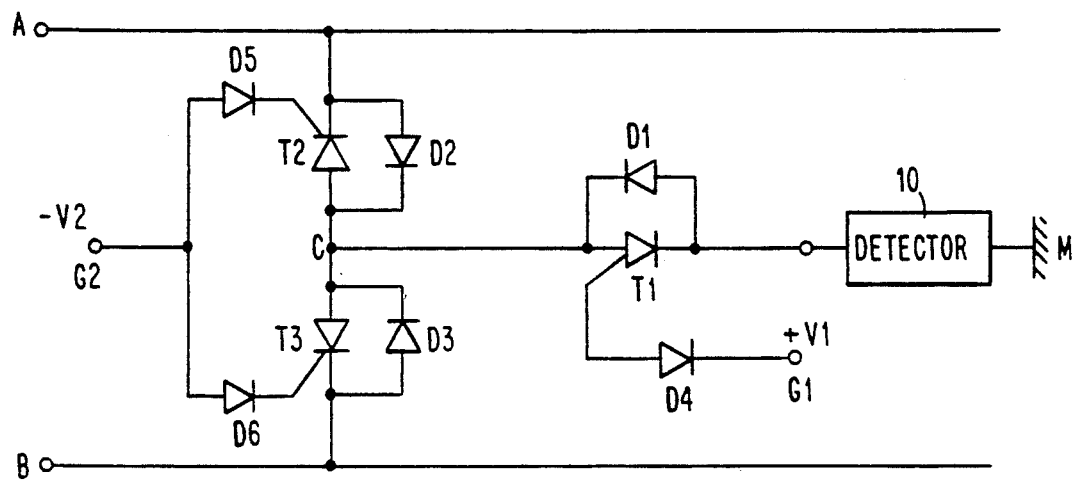
FIG. 1 schematically shows a line protection circuit.

FIG. 1 shows a protection circuit adapted to two conductors A and B and enabling to clip positive overvoltages higher than a value V1 or negative overvoltages lower than a value $-V2$ with respect to ground. The circuit comprises three thyristors T1, T2, T3, the anodes of which are connected to a common point C and the cathodes are connected to ground M, the first conductor A and second conductor B, respectively. To each thyristor is associated a diode in anti-parallel, D1, D2, D3, respectively. Thyristor T1 is an anode-gate thyristor and thyristors T2 and T3 are cathode-gate thyristors. The gate of thyristor T1 is connected to a control terminal G1 through an isolating diode T4. Terminal G1 is connected to a positive voltage source V1 slightly lower than the positive voltage to be clipped. The gates of thyristors T2 and T3 are connected to a control terminal G2 through isolating diodes D5 and D6. Terminal G2 is connected to a potential $-V2$, voltage V2 being slightly lower than the negative voltage to be clipped.

The operation of the circuit is as follows.

A positive overvoltage on conductor A will flow through diode D2 and through thyristor T1 rendered conductive due to the fact that the potential at point C is higher than the control voltage V1 on gate G1.

Similarly, a positive overvoltage on the conductor will flow through diode D3 and thyristor T1.

A negative overvoltage on conductor A will render thyristor T2 conductive and will flow through the thyristor and, either to ground through diode D1 or to the other conductor through diode D3.

Similarly, a negative overvoltage on conductor B will flow through thyristor T3 and to conductor A through diode D2 or to ground through diode D1.

Thus, in case of negative overvoltage, with the circuit of FIG. 1, overvoltage is enabled to flow either to ground or to the other conductor. The overvoltage will preferably flow to the other conductor if the latter is at a higher potential than the one of ground. This has a drawback because, generally, it is desired that the circuits designed for eliminating overvoltages detect that trouble (overvoltage) has occurred. For this purpose, a detector 10 is used for indicating if current has flown to or from ground. In case of overvoltage transmitted from one conductor to another, the detector will not detect the flow of ground current and no trouble will be indicated.

Figure 2:
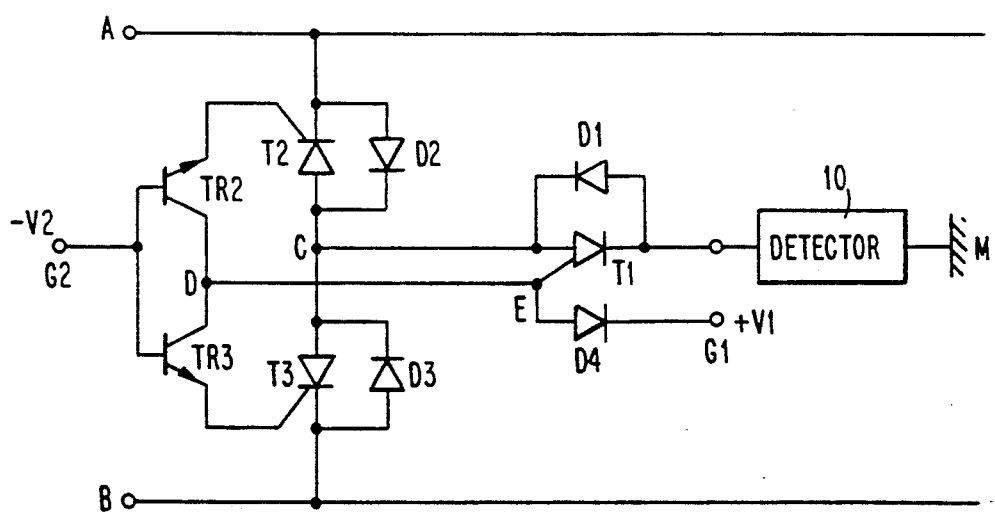
FIG. 2 shows an embodiment of a line protection circuit according to the invention.

To solve this problem, the invention provides a circuit diagram as shown in FIG. 2. In this diagram, each thyristor T2 and T3 is associated with a transistor, TR2 and TR3, respectively, for amplifying the gate current. Each transistor is connected by its emitter to the corresponding thyristor cathode gate and by its base to the control terminal G2. The collectors of transistors TR2 and TR3 are coupled to a common point D connected to the gate E of the anode-gate thyristor T1. Then, when a negative overvoltage occurs on conductor A, thyristor T2 and transistor TR2 become conductive. The conduction transition of transistor TR2 causes, because of the connection between points D and E, the flow of a gate current in thyristor T1 and turns it on. Thus, a determined current will flow through diode D3 and thyristor T1 to ground in addition to the current flowing through diode D3 and thyristor T2 to absorb overvoltage. Thus, detector 10 will detect trouble.

In the above, it has been assumed that the three thyristors T1, T2, T3 were connected by their anodes, thyristor T1 being an anode-gate thyristor and thyristors T2 and T3 being of the cathode-gate type. Similarly, it is possible to symmetrically devise that thyristors T2, T3 and T1 are connected by their cathode. In this case, thyristor T1 would be replaced by a cathode-gate thyristor and thyristors T2 and T3 by anode-gate thyristors.

An advantage of the circuit of FIG. 2, according to the invention, it that, in addition to the fact it solves the problem encountered for detecting trouble on a conductor, it can be monolithically integrated.

Figure 3:
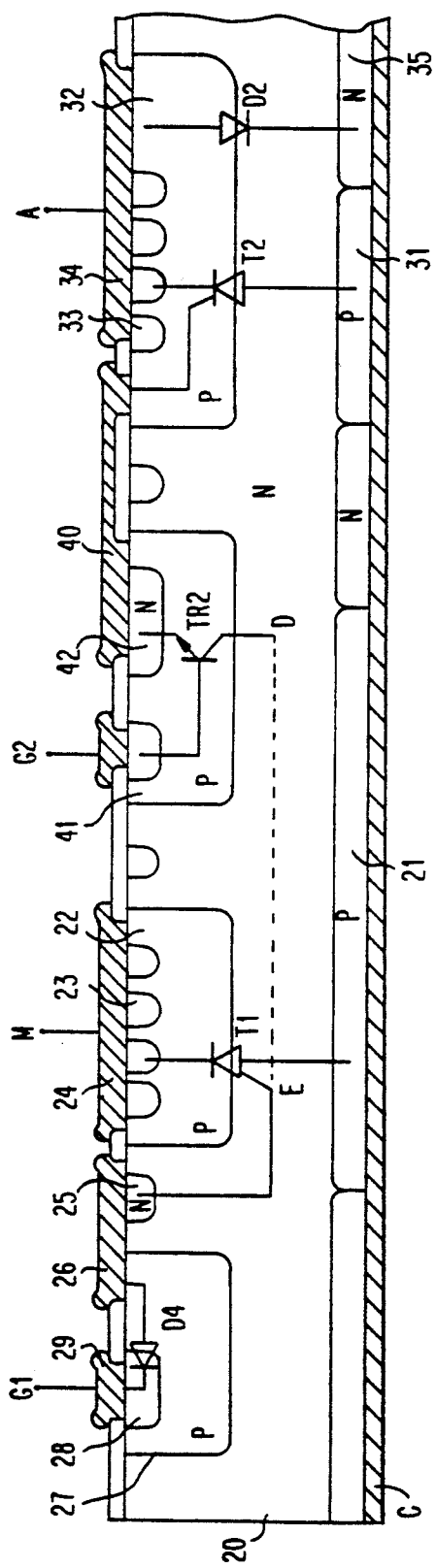
FIG. 3 shows an exemplary monolithic structure implementing the circuit of FIG. 3.

A simplified drawing of such a monolithic integration is partially illustrated in FIG. 3 where are represented diode D4, thyristor T1, transistor TR2, thyristor T2 and diode D2. The figure does not show diode D1 associated with thyristor T1, diode D2 associated with thyristor T2, nor the assembly T3, D3, TR3 similar to the assembly T2, D2, TR2.

The monolithic component of FIG. 3 is formed from an N-type silicon wafer 20 coated on its rear surface with a metallization C.

The anode-gate thyristor T1 comprises, from the lower surface, an overdoped P region 21, substrate 20, a P well 22, and an N layer 23 provided with emitter shorts and coated with a metallization 24 connected to ground through a detector 10 (not shown). Metallization 24 also coats a portion (not shown) of well 22 not coated by layer 23 constituting the anode of diode D1. The anode-gate region of thyristor T1 is connected, through an overdoped N-type region 25, by a metallization 26 which connects it to a P well 27 wherein an N region 28 is diffused, regions 27 and 28 forming diode D4. A metallization 29 coating the N region 28 is connected to terminal G1 intended to be connected to a positive polarization source $+V1$.

The cathode-gate thyristor T2 comprises, from the lower surface, a P region 31, the N substrate 20, a P well 32 and an N region 33 provided with emitter shorts and coated with an anode metallization 34 connected to conductor A.

Diode D2 is formed between metallization 33 and the rear surface metallization C by the P well 32, N substrate 20 and an N overdoped layer 35 on the lower surface side.

A metallization 40 contacts the P well 32 and corresponds to the cathode gate of thyristor T2.

Figure 4:
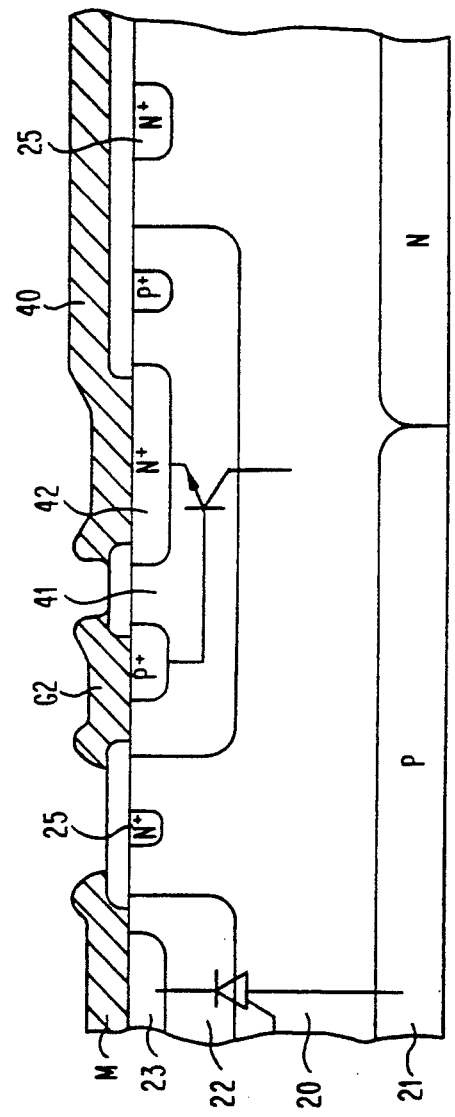
FIG. 4 shows a portion of the structure of FIG. 3 drawn to enlarged scale.

Transistor TR2 is shown in the middle of the drawing. Its base corresponds to a P well 41, its emitter to a layer 42 formed in well 41 and connected by metallization 40 to the gate region of thyristor T2. The collector of transistor TR2 corresponds to the N substrate 20. As shown in more detail in FIG. 4, the P diffusion 21 of the anode of thyristor T1 extends at least partially under the N+emitter region 42 of transistor TR2; so, it can be considered that the collector D of transistor TR2 is connected to the anode gate E of thyristor T1. Of course, transistor TR2 must be disposed at close vicinity of thyristor T1. Transistor TR3 (not shown) will be arranged in the same way.

Those skilled in the art will note that various variants and modifications can be brought to the circuit implementation according to the invention. For example, the figure shows N+overdoped regions arranged between the wells and acting as stop-channels. On the other hand, overdoped regions have not always been represented at the contacting place between a metallization and the underlying layer. Such an overdoped region will be necessary if the region which is contacted by the metallization is not sufficiently doped.

Those skilled in the art will also note that an advantage of the invention lies in the fact that no deep diffusion regions serving as electric isolation between the elementary components of the circuit are provided.

We claim:

1. A circuit for protecting lines such as telephone lines against positive or negative overvoltages having respective determined minimum values ($+V1$ and $-V2$), comprising: a first protection component connected between a common point and a first conductor, a second protection component connected between said common point and a second conductor, and a third protection component connected between said common point and a ground, each protection component constituted by a respective diode. (D1, D2, D3) in anti-parallel with a respective thyristor (T1, T2, T3), the anode said thyristor is connected to said common point and the gate said thyristor receives a polarization signal, the first and second thyristors being of the cathode-gate type and the third (T1) of the anode-gate type, wherein each of the first and second thyristors is associated with a transistor (TR2, TR3) for amplifying the gate current, the emitter of each transistor being connected to the gate of the corresponding thyristor and the collector of each transistor being connected to a second common point (D) connected to the gate of the third thyristor.

2. A circuit for protecting lines such as telephone lines against positive or negative overvoltages having respective determined values ($+V1$ and $-V2$), comprising: a first protection component connected between a common point and a first conductor, a second protection component connected between said common point and a second conductor, and a third protection component connected between said common point and a ground, each protection component constituted by a respective diode (D1, D2, D3) in anti-parallel with a respective thyristor (T1, T2, T3), the cathode, said thyristor is connected to said common point and the gate said thyristor receives a polarization signal, the first and second thyristors being of the anode-gate type and the third (T1) of the cathode-gate type, wherein each of said first and second thyristors is associated with a transistor (TR2, TR3) for amplifying the gate current, the emitter of each transistor being connected to the gate of the corresponding thyristor and the collector of each transistor being connected to a second common point (D) connected to the gate of said third thyristor.

3. A protection circuit according to claim 1, wherein the base of each transistor and the gate of said third thyristor are connected to respective polarization voltages.

4. A protection circuit according to claim 1, wherein the circuit is a monolithic structure incorporating the components achieved from an N-type silicon substrate (20), the rear surface of which corresponds to the common point and the front surface comprises various connection metallizations to said conductors, to ground and to polarization voltages, said anode-gate thyristor (T1) comprising, from the rear surface: a P-type overdoped layer (21), the substrate (20) corresponding to the anode gate, a P-type well (22) and, on the front surface side, an N-type region (23) provided with emitter shorts, connected to a cathode metallization (24), each cathode-gate thyristor (T2, T3) comprising, from the rear surface, a P-type region (31), substrate (20), a P-type well (32) corresponding to the cathode gate and an N-type region (33) provided with emitter shorts and coated with a cathode metallization (34), each gate amplification transistor (TR1, TR2) being formed close to the anode-gate thyristor and comprising, from the front surface, a P-type well (41) corresponding to its base wherein is formed an N+-type region (42) corresponding to its emitter and connected by a metallization (40) to the gate well of said corresponding cathode-gate thyristor, the collector of said transistor corresponding to the substrate and therefore to the anode-gate region of said anode-gate thyristor, the rear surface of the substrate, facing the base well of the considered transistor, mainly comprising a P-type region (21).

5. A protection circuit according to claim 2, wherein the base of each transistor and the gate of said third thyristor are connected to respective polarization voltages.

* * * * *